(12) United States Patent
Varadarajan et al.

(10) Patent No.: US 12,009,045 B2
(45) Date of Patent: Jun. 11, 2024

(54) MANAGEMENT OF MULTIPLE MEMORY IN-FIELD SELF-REPAIR OPTIONS

(71) Applicant: TEXAS INSTRUMENTS INCORPORATED, Dallas, TX (US)

(72) Inventors: Devanathan Varadarajan, Allen, TX (US); Varun Singh, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/843,897

(22) Filed: Jun. 17, 2022

(65) Prior Publication Data

US 2022/0319627 A1 Oct. 6, 2022

Related U.S. Application Data

(63) Continuation of application No. 16/539,805, filed on Aug. 13, 2019, now Pat. No. 11,373,726.

(60) Provisional application No. 62/828,543, filed on Apr. 3, 2019.

(51) Int. Cl.
*G11C 29/44* (2006.01)
*G11C 17/16* (2006.01)
*G11C 29/14* (2006.01)
*G11C 29/42* (2006.01)

(52) U.S. Cl.
CPC .......... *G11C 29/4401* (2013.01); *G11C 17/16* (2013.01); *G11C 29/14* (2013.01); *G11C 29/42* (2013.01)

(58) Field of Classification Search
CPC ..... G11C 29/4401; G11C 17/16; G11C 29/14; G11C 29/42
See application file for complete search history.

(56) References Cited

U.S. PATENT DOCUMENTS 5,764,878 A * 6/1998 Kablanian ............... G11C 29/44
714/6.11
5,920,515 A * 7/1999 Shaik .................... G11C 29/844
365/201
6,011,734 A * 1/2000 Pappert .................. G11C 29/72
365/201

(Continued)

FOREIGN PATENT DOCUMENTS

CN 101329918 A 12/2008
CN 102113058 A 6/2011

(Continued)

OTHER PUBLICATIONS

PCT International Search Report; PCT/US 2020/025999; dated Jun. 25, 2020; 2 pages.

(Continued)

*Primary Examiner* — Guy J Lamarre
*Assistant Examiner* — Osman M Alshack
(74) *Attorney, Agent, or Firm* — Brian D. Graham; Frank D. Cimino

(57) ABSTRACT

A system includes a processor and a memory set coupled to the processor. The system also includes a repair circuit coupled to the memory set. The repair circuit includes a first repair circuit and a second repair circuit. The repair circuit also includes a test controller configured to select between the first repair circuit and the second repair circuit to perform an in-field self-repair of the memory set.

20 Claims, 5 Drawing Sheets

(56) References Cited

U.S. PATENT DOCUMENTS

| | | | |
|---|---|---|---|
| 6,259,637 B1* | 7/2001 | Wood | G11C 29/44 |
| | | | 365/201 |
| 6,304,499 B1* | 10/2001 | Pochmuller | G11C 29/74 |
| | | | 365/201 |
| 6,874,111 B1 | 3/2005 | Adams et al. | |
| 7,149,921 B1* | 12/2006 | Zorian | G11C 29/72 |
| | | | 714/30 |
| 8,495,436 B1 | 7/2013 | Agrawal et al. | |
| 11,069,426 B1* | 7/2021 | Wieduwilt | G11C 29/787 |
| 2001/0052093 A1 | 12/2001 | Oshima et al. | |
| 2003/0206470 A1* | 11/2003 | Leader | G11C 29/72 |
| | | | 365/201 |
| 2004/0246796 A1 | 12/2004 | Konuk et al. | |
| 2005/0047229 A1 | 3/2005 | Nadeau-Dostie et al. | |
| 2005/0172180 A1 | 8/2005 | Damodaran et al. | |
| 2008/0263392 A1 | 10/2008 | Fujiwara et al. | |
| 2009/0199056 A1 | 8/2009 | Murata | |
| 2010/0100779 A1* | 4/2010 | Moriya | G11C 29/028 |
| | | | 714/E11.021 |
| 2010/0125766 A1 | 5/2010 | Anzou et al. | |
| 2011/0213945 A1* | 9/2011 | Post | G06F 3/061 |
| | | | 711/E12.002 |
| 2013/0212207 A1 | 8/2013 | Ong | |
| 2014/0245105 A1 | 8/2014 | Chung et al. | |
| 2015/0270016 A1 | 9/2015 | Varadarajan et al. | |
| 2016/0155515 A1 | 6/2016 | Son et al. | |
| 2017/0011809 A1 | 1/2017 | Yano | |
| 2017/0147434 A1 | 5/2017 | Bae | |
| 2017/0184662 A1 | 6/2017 | Varadarajan et al. | |
| 2017/0308447 A1 | 10/2017 | Wu | |
| 2017/0372791 A1 | 12/2017 | Hatsuda | |
| 2018/0095823 A1 | 4/2018 | Fahim et al. | |
| 2018/0314595 A1* | 11/2018 | Eichmeyer | G06F 11/1048 |
| 2019/0087263 A1 | 3/2019 | Cha et al. | |
| 2019/0107576 A1 | 4/2019 | Sinegre et al. | |
| 2019/0140666 A1 | 5/2019 | Lee | |
| 2019/0250985 A1 | 8/2019 | Seo et al. | |

FOREIGN PATENT DOCUMENTS

| | | |
|---|---|---|
| CN | 103578562 A | 2/2014 |
| CN | 104969300 A | 10/2015 |
| CN | 108877870 B | 11/2018 |

OTHER PUBLICATIONS

Machine Translation for CN104969300A.
Machine Transalation for CN108877870B.
Machine Translation for CN101329918A.
Machine Translation for CN102113058A.
Machine Translation for CN103578562A.

* cited by examiner

MANAGEMENT OF MULTIPLE MEMORY IN-FIELD SELF-REPAIR OPTIONS

CROSS-REFERENCE TO RELATED APPLICATIONS

This application is a Continuation of prior U.S. patent application Ser. No. 16/539,805, filed Aug. 13, 2019, which claims priority to U.S. Provisional Patent Application No. 62/828,543, filed Apr. 3, 2019, titled "Management of Multiple Memory In-Field Self-Repair Options," all of which are hereby incorporated herein by reference in their entirety.

BACKGROUND

Integrated circuits (ICs) generally include various modules combined to perform various functions. For example, a digital signal processor (DSP) includes processor and memory blocks embedded in the IC. The memory blocks containing plurality of addressable memory locations are tested for defects, ensuring the operability of the C. To test these blocks, special test circuits; referred to as "Built-In Self Test" (BIST) circuits are incorporated into the IC. BIST circuits generate a test pattern to determine whether the memory block is defective or not. In some cases, the circuit provides redundant rows and/or columns that are used to reconfigure the memory to use redundant rows and/or columns instead of the defective rows and/or columns in the memory block. The process of reconfiguring the memory to use redundant rows and/or columns instead of defective rows and/or columns is referred to as physical memory repair.

Electronic fuse (e.g., Efuse or fuseROM) components are also used for memory repair. Electronic fuse components store repair data or repair signatures to identify and repair defective elements of memory blocks. The number of electronic fuse components is directly related to the sum of the number of memory blocks under test. With increasing memory blocks in modern system-on-a-chip (SoC) products, memory repair has become crucial to improve yield during manufacturing test and the use of error-correcting codes (ECC) to tolerate errors has become prevalent to improve reliability of these memory blocks in the field during functional operation. Known implementations of ECC involve storing an additional signature along with the memory data wherein the signature satisfies a specific mathematical equation with the data. Upon every memory read, both data and signature are read and the mathematical equation of read data is evaluated. The evaluated signature is compared with the stored signature that is read to detect and correct errors in the data. The number of signature bits and/or the mathematical equation used determines the number of errors that can be detected and/or corrected. The process of correcting the errors in the memory with ECC is referred to as logical memory repair. Efforts to balance IC footprint size, memory test and repair efficiency, and memory repair flexibility are ongoing.

SUMMARY

In accordance with at least one example of the disclosure, a system comprises a processor and a memory set coupled to the processor. The system also comprises a memory repair circuit coupled to the memory set. The memory repair circuit comprises a first repair circuit and a second repair circuit. The memory repair circuit also comprises a test controller configured to select between the first repair circuit and the second repair circuit to perform an in-field self-repair of the memory set.

In accordance with at least one example of the disclosure, a device comprises a memory set and a memory repair circuit coupled to the memory set. The memory repair circuit comprises a test circuit, an error mask circuit, and an incremental repair circuit. The memory repair circuit also comprises a test controller coupled to the test circuit, the error mask circuit, and the incremental repair circuit. The test controller is configured to select between the error mask circuit and the incremental repair circuit to perform an in-field self-repair of the memory set.

In accordance with at least one example of the disclosure, a system-on-a-chip (SoC) comprises a memory set with a plurality of different memory units, each of the different memory units having its own repair architecture. The SoC also comprises a memory repair circuit coupled to the memory set. The memory repair circuit comprises a test circuit configured to: provide a local pass/fail determination for each of the different memory units within the memory set, provide error-correcting code (ECC)-aware regionalization of a dataword, and provide ECC-aware error masking. The memory repair circuit also comprises a repair circuit configured to repair in-field self-repair of the memory set. The memory repair circuit also comprises a test controller coupled to the test circuit and the repair circuit, wherein the test controller is configured to selectively enable and disable the repair circuit.

BRIEF DESCRIPTION OF THE DRAWINGS

For a detailed description of various examples, reference will now be made to the accompanying drawings in which.

DETAILED DESCRIPTION

Figure 1:
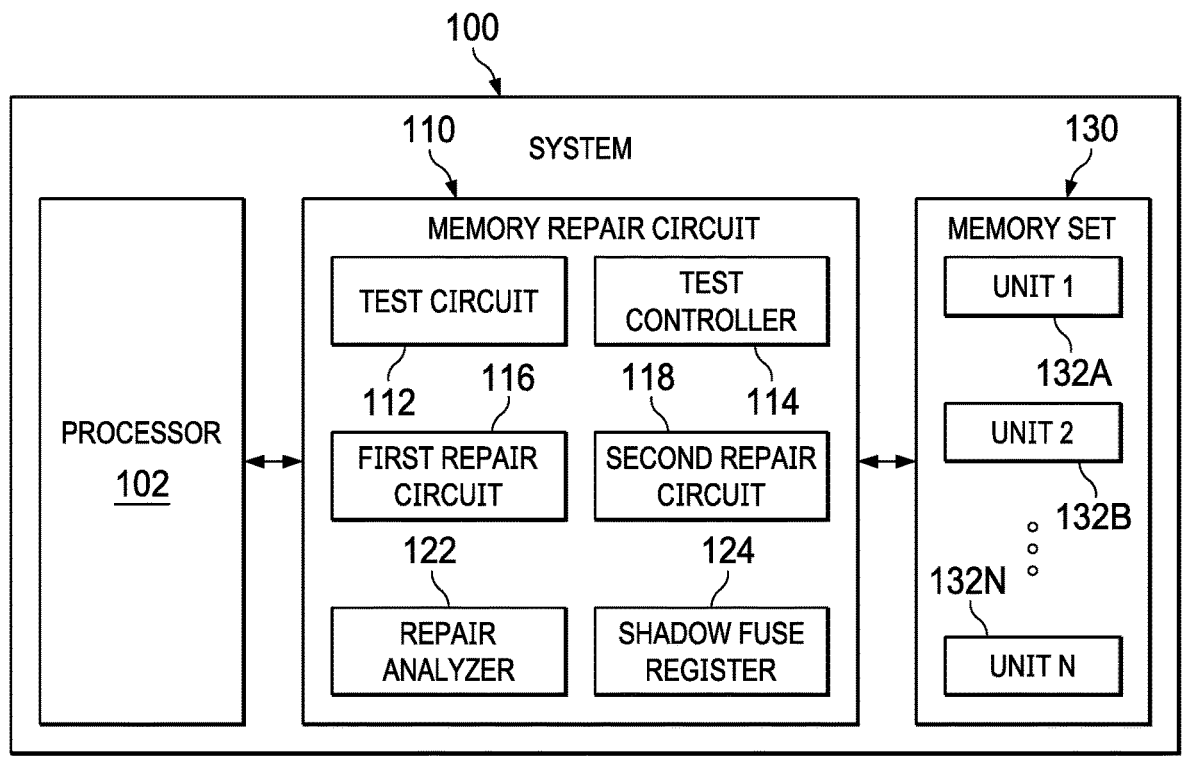
FIG. 1 is a block diagram showing a system in accordance with some examples.

Disclosed herein are systems with multiple memory in-field self-repair options and related control components and methods. An example system is a system-on-a-chip (SoC) integrated circuit (IC), where the system includes a processor and a memory set coupled to the processor. The system also includes a memory repair circuit coupled to the memory set. In some examples, the memory repair circuit comprises a first repair circuit and a second repair circuit. The memory repair circuit also comprises a test controller configured to select between the first repair circuit and the second repair circuit to perform an in-field self-repair of the memory set. In other examples, the memory repair circuit comprises at least one repair circuit that is selectively enabled or disabled by a test controller. In some examples, the repair circuit or first repair circuit is an error mask circuit. Meanwhile, the second repair circuit is an incremental repair circuit. As used herein, an "error mask circuit" refers to a circuit that is programmed to mask a predefined number of bit errors in the memory output data. As used herein, an "incremental repair circuit" refers to a circuit that is capable of incrementally reconfiguring the memory in the field to use additional redundant rows and/or columns to replace defective rows and/or columns. The term incremental is used to indicate that this repair or reconfiguration done in-field should be in addition to those already repaired during manufacturing test. In some examples, the memory set includes a plurality of different memory units, each of the different memory units having its own repair architecture. As needed, the memory repair circuit is configured to adjust itself based on the respective repair architectures for each of the different memory units.

In some examples, a repair circuit is enabled or disabled based on in-field debug and/or diagnostic operations. In some examples, in response to a repair need and/or based upon a predetermined repair strategy, the test controller is configured to select between the first repair circuit and the second repair circuit to perform an in-field self-repair of the memory set or individual memory units of the memory set. In one example, the test controller selects the first repair circuit to perform an in-field self-repair on one of the different memory units in response to the test controller determining that a repair compatible with the first repair circuit is available. In another example, the test controller selects the second repair circuit to perform in-field self-repair on one of the different memory units in response to the test controller determining that a repair compatible with the first repair circuit is not available.

In some examples, the memory repair circuit includes components configured to provide: 1) a local pass/fail or error determination for each of the different memory units of a memory set; 2) ECC-aware regionalization of a dataword; and 3) ECC-aware error masking. In some examples, the memory repair circuit also includes a shadow fuse register for each of the different memory units, where each shadow fuse register is configured to be initialized with the respective repair code of the different memory units from a FuseROM upon every electronic fuse autoload. The memory repair circuit is configured to provide a cumulative repair code for different memory test sessions, and to assert an error in response to identifying a non-repairable error based on the cumulative repair code. The memory repair circuit is also configured to selectively reload contents of a shadow fuse register into a respective one of the different memory units to perform in-field self-repair operations. To provide a better understanding, various memory repair circuit options involving management of multiple memory in-field self-repair options are described using the figures as follows.

FIG. 1 is a block diagram showing a system 100 in accordance with some examples. As shown, the system 100 includes a processor 102, a memory repair circuit 110 coupled to the processor 102, and a memory set 130 coupled to the memory repair circuit 110. In different examples, the system 100 is representative of an IC, SoC, or multi-die module.

In the example of FIG. 1, the memory set 130 includes a plurality of memory units 132A-132N, which correspond to different memory modules or different memory zones, where each of the memory unit 132A-132N has a different repair architecture. As used herein, a "repair architecture" may refer to physical repair architecture or logical repair architecture. A physical repair architecture involves reconfiguring the memory unit to use a limited number of redundant rows and/or columns as needed to overcome the defective rows and/or columns of the respective memory unit. In contrast, a logical repair architecture refers to correcting the memory output using ECC. For example, a memory unit with an ECC repair architecture uses additional bits for storing signature that is used to automatically detect and correct errors. Meanwhile, a memory unit with an incremental repair architecture uses redundant rows and/or columns for repairs. Also, some memory units of a memory set may have both ECC repair architecture and incremental repair architecture, while other memory units of a memory set have only one repair architecture, or no repair architecture.

In the example of FIG. 1, memory repairs for the system 100 are performed by the memory repair circuit 110, which includes a test circuit 112, a test controller 114, a first repair circuit 116, and a second repair circuit 118. In some examples, the first repair circuit 116 corresponds to an ECC repair circuit, and the second repair circuit 118 corresponds to an incremental repair circuit. When a repair need is detected by the test circuit 112, the test controller 114 is configured to determine if the repair is possible for a given memory unit (the amount of redundant rows/columns available for each of the memory units 132A-132N is limited). To make this determination, the test controller 114 receives information from a repair analyzer circuit 122 and shadow fuse register(s) 124.

In response to a repair need and/or based upon a predetermined repair strategy, the test controller 114 is configured to select between the first repair circuit 116 and the second repair circuit 116 to perform an in-field self-repair of the memory set 130 or individual memory units 132A-132N of the memory set 130. In one example, the test controller 114 selects the first repair circuit 116 to perform an in-field self-repair on one of the different memory units 132A-132N in response to the test controller 114 determining that a repair compatible with the first repair circuit 116 is available. In another example, the test controller 114 selects the second repair circuit 118 to perform in-field self-repair on one of the different memory units 132A-132N in response to the test controller 114 determining that a repair compatible with the first repair circuit 116 is not available. In some examples, the first repair circuit 116 and/or the second repair circuit 118 is selectively enabled or disabled. Also, in some examples, one of the first repair circuit 116 and the second repair circuit 118 is omitted, and the remaining repair circuit is selectively enabled or disabled.

In one example, the system 100 includes only an ECC repair circuit, and the ECC repair circuit is selectively enabled and disabled. In another example, the system 100 includes only an incremental repair circuit, and the incremental repair circuit is selectively enabled and disabled. In another example, the system 100 includes both an ECC repair circuit and an incremental repair circuit, where the ECC repair circuit is selectively enabled and disabled. In another example, the system 100 includes both an ECC repair circuit and an incremental repair circuit, where the incremental repair circuit is selectively enabled and disabled. In another example, the system 100 includes both an ECC repair circuit and an incremental repair circuit, where both repair circuits are enabled or disabled. When both ECC and incremental repair circuits are enabled, one may have a higher priority when a repair is needed. In some examples, the priority level is predetermined (e.g., ECC repair or incremental repair preferred). In other examples, the priority level is adjustable based on user input or predetermined triggers.

In some examples, the test circuit 112 of the memory repair circuit 110 is configured to provide: 1) a local pass/fail or error determination for each of the different memory units 132A-132N of a memory set 130; 2) ECC-aware regionalization of a dataword; and 3) ECC-aware error masking. In some examples, the memory repair circuit 110 also includes a shadow fuse register 124 for each of the different memory units 132A-132N, where each shadow fuse register 124 is configured to be initialized with the respective repair code of the different memory units from a FuseROM upon every electronic fuse autoload. The memory repair circuit 110 also comprises a repair analyzer circuit 122 configured to provide a cumulative repair code for different memory test sessions, and to assert an error in response to identifying a non-repairable error based on the cumulative repair code. As needed, the memory repair circuit 110 is configured to selectively reload contents of a shadow fuse register 124 into a respective one of the different memory units 132A-132N to perform in-field self-repair operations.

Figure 2A:
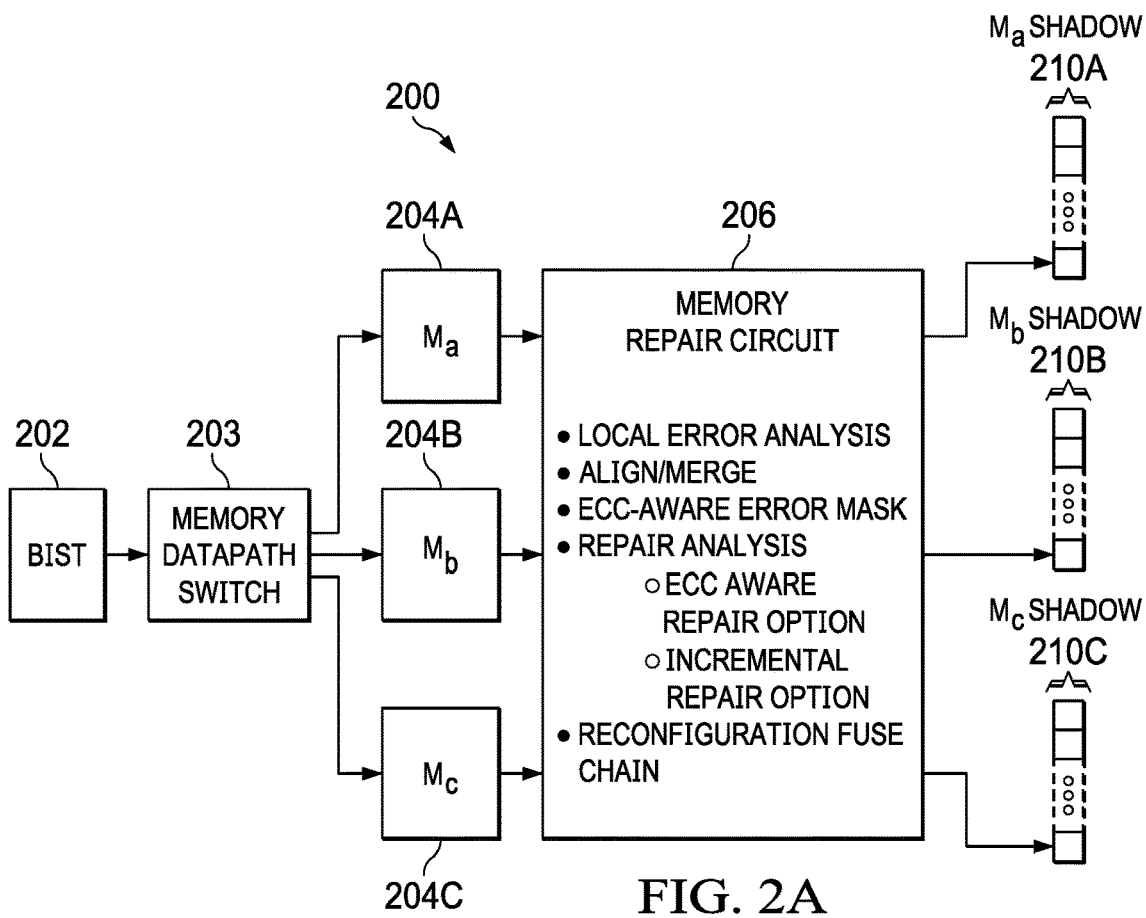
FIG. 2A is a block diagram showing a memory repair scenario in accordance with some examples.

FIG. 2A is a block diagram showing a memory repair scenario 200 in accordance with some examples. In the memory repair scenario 200, various components are represented including a built-in self-test (BIST) unit 202 (an example of test circuit 112), memory datapath switch 203, memory units 204A-204C (examples of the memory units 132A-132N in FIG. 1), a memory repair analyzer circuit 206 (an example of at least some of the memory repair analyzer 122 in FIG. 1), and shadow fuse registers 210A-210C (examples of the shadow fuse registers 124). In different examples, the components represented for the memory repair scenario 200 are part of an IC, SoC, or multi-die module.

In the memory repair scenario 200, the BIST unit 202 performs various operations (such as write and read) to test the memory units 204A-204C before and after a repair is complete. For example, the BIST unit 202 may test the memory units with one or more test sequences using memory datapath switch 203. The datapath switch 203 is used to select one or more of memory units 204A-204C (simultaneous or not) for testing by the BIST unit 202 in a test session. The test sequences used by the BIST unit 202 may vary based on the order of operations on the memory (such as write and read), the data background that is used for the operations (e.g., all 0s, alternating 0-1s, etc.), addressing order of the words within the memory unit (e.g., increasing columns, decreasing rows, ping-pong, etc.), or other options. In some examples, multiple sequences are used for testing with each test sequence fine-tuned to target a specific defect within a memory unit.

To perform a repair, the memory repair circuit 206 is configured to perform various operations. In some examples, the memory repair circuit 206 includes local error analysis that compares the output of memory units with the expected value to identify errors local to each memory unit. In some examples, the memory repair circuit 206 includes align and merge components, which aligns and merges error values from diverse memory architectures into a unified memory architecture to reuse common circuitry for the subsequent stages of repair analyzer logic across diverse memory architecture. In some examples, the memory repair circuit 206 includes ECC-aware error mask components. The ECC-aware error mask components enable ECC-aware tests and repair options. As desired, the memory repair circuit 206 may be configured to bypass the ECC-aware error mask components. In such case, ECC-aware tests and repair options are not available.

As represented in FIG. 2A, the memory repair circuit 206 also includes repair analysis components. In some examples, the repair analysis components support an ECC option and an incremental repair option. For the ECC repair option, the repair analysis components work with the ECC-aware error mask components. Thus, if the ECC-aware error mask components are bypassed, the ECC repair option is not available. Also, in different examples, the ECC repair option and the incremental repair option have different priorities. In one example, the ECC repair option has a higher priority than the incremental repair option. In another example, the ECC repair option has a lower priority than the incremental repair option.

ECC repair and/or incremental repair may be enabled or disabled for in-field debug and diagnostic reasons. In some scenarios, the ECC repair option is the only memory repair option available. In such scenarios, ECC repairs are selectively enabled or disabled. In some scenarios, only an incremental repair option is available. In such scenarios, the incremental repair option is selectively enabled or disabled. In some scenarios, both an ECC option and an incremental repair option is available. In such scenarios, one of the available repair options is given higher priority. In some examples, incremental repair requires reprogramming FuseROMs to store the additional repair values resulting in additional latency for memory test. In other examples, ECC repair requires calculating signature and correcting the data in case of signature mismatch resulting in additional latency for memory test. For latency-sensitive applications, ECC repair or incremental repair may be given a higher priority based on its relative latency overhead.

In some examples where align and merge components are used, the memory repair circuit 206 also includes reconfigurable fuse chain components that helps reconfigure the fuse encode information from the unified memory repair architecture (resulting from align/merge and repair analysis operations) back to the repair architecture of the specific memory unit under test. The reconfiguration fuse chain component of the memory repair circuit 206 receives the fuse encode information from the repair analysis component of the memory repair circuit 206 and updates the shadow fuse registers 210A-210C, where the shadow fuse register 210A stores repair information (e.g., a repair signature that tracks all repairs) for the memory unit 204A, the shadow fuse register 210B stores repair information for the memory unit 204B, and the shadow fuse register 210C stores repair information for the memory unit 204C.

Figure 2B:
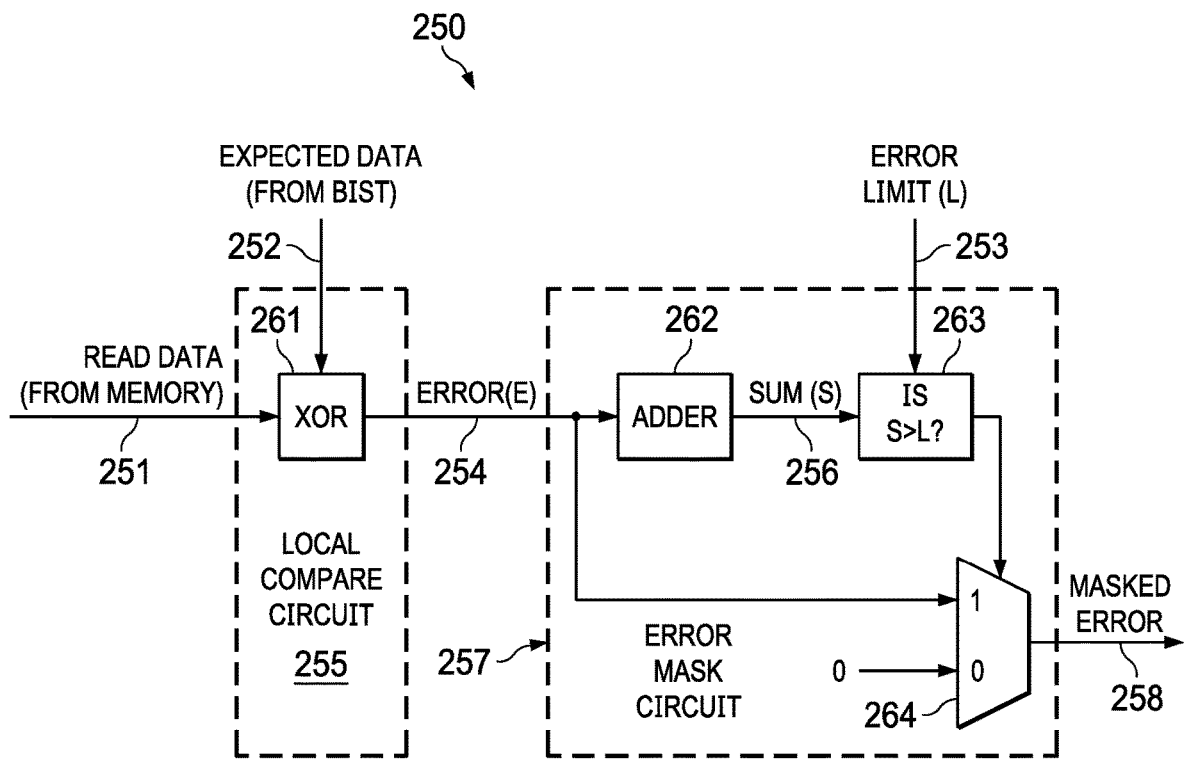
FIG. 2B is a block diagram showing an error mask circuit used in memory repair in accordance with some examples.

FIG. 2B is a block diagram showing an error mask circuit 250 used in memory repair in accordance with some examples. In the example of FIG. 2B, the error mask circuit 250 (an example of the ECC-aware error mask in 206 in FIG. 2) is able to mask a predefined number of errors. The error mask circuit 250 has as its inputs the output data from memory 251, expected data 252 and a predefined error limit 253 (labeled "L") as per the supported ECC configuration of the respective memory. The error mask circuit 250 first computes the error 254 (labeled "E") between the output data and the expected data, which may be achieved using an exclusive-OR operation 261. In the example of FIG. 2B, the error mask circuit 250 includes local compare logic 255, which compares the memory output with the expected data local to each memory unit. The error mask circuit 250 then computes the total number of bit errors 256 (labeled "S"), which may be achieved using an addition operation 262. The value 256 is checked to be greater than the error limit 253 in the logic 263. If the comparison of logic 263 is false (indicating the number of errors being less than the limit L), the multiplexer 264 returns 0 as the output masked error 258. Otherwise, the error mask circuit returns the computed error 254 as the output masked error 258.

Figure 3:
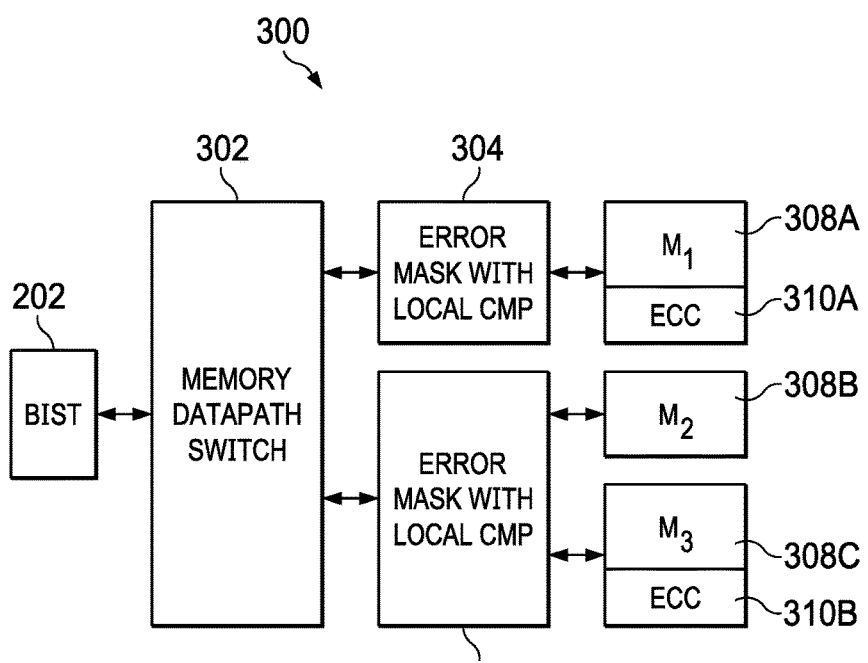
FIG. 3 is a block diagram showing a memory repair scenario in accordance with some examples.

FIG. 3 is a block diagram showing a memory repair scenario 300 in accordance with some examples. In the memory repair scenario 300, various components are represented including the BIST unit 202, a memory datapath switch 302, a first ECC-aware error mask component 304, a second ECC-aware error mask component 306, and memory units 308A-308C. In the example of FIG. 3, the memory datapath switch 302 performs the same function as the memory datapath switch 203 of FIG. 2 and enables the BIST unit 202 to test one or more memory units 308A-308C simultaneously in a test session. The first and second ECC-aware error mask components 304 and 306 perform the same function as the error mask component 250 of FIG. 2B. In different examples, the components represented for the memory repair scenario 300 are part of an IC, SoC, or multi-die module.

In the memory repair scenario 300, the BIST unit 202 performs various operations to test the memory units 308A-308C before and after a repair is complete. In the memory repair scenario 300, the memory units 308A and 308C support ECC repairs. More specifically, the memory unit 308A includes additional bits 310A to store ECC signature for ECC repairs. The memory unit 308C also includes additional bits 310B to store ECC signature to support ECC repairs on memory units 308B and 308C. Note: the number of additional bits 310B may have the same number or a different number relative to the number of additional bits 310A. Also, the memory unit 308B does not include signature bits within it and instead relies on signature bits stored within 308C. Thus, each of the memory units 308A-308C includes its own repair architecture (or no repair architecture) in the memory repair scenario 300.

The error mask with local compare components 304 and 306 enable ECC-aware tests and repair options and are example implementations of error mask with local compare circuit 250 of FIG. 2B. As desired, the error mask components 304 and 306 may be bypassed. In such case, ECC-aware tests and repair options are not available. Thus, when the first and second error mask components 304 and 306 are enabled, ECC repairs for the memory units 308A, 308B and 308C are available (with 308B and 308C sharing the signature 310B and having a common shared bit error limit L as illustrated in 253 of FIG. 2a). On the other hand, when the first and second error mask components 304 and 306 are disabled, ECC repairs for the memory units 308A, 308B and 308C are not available even if there are bit errors that can be corrected with 310A and 310B.

Figure 4A:
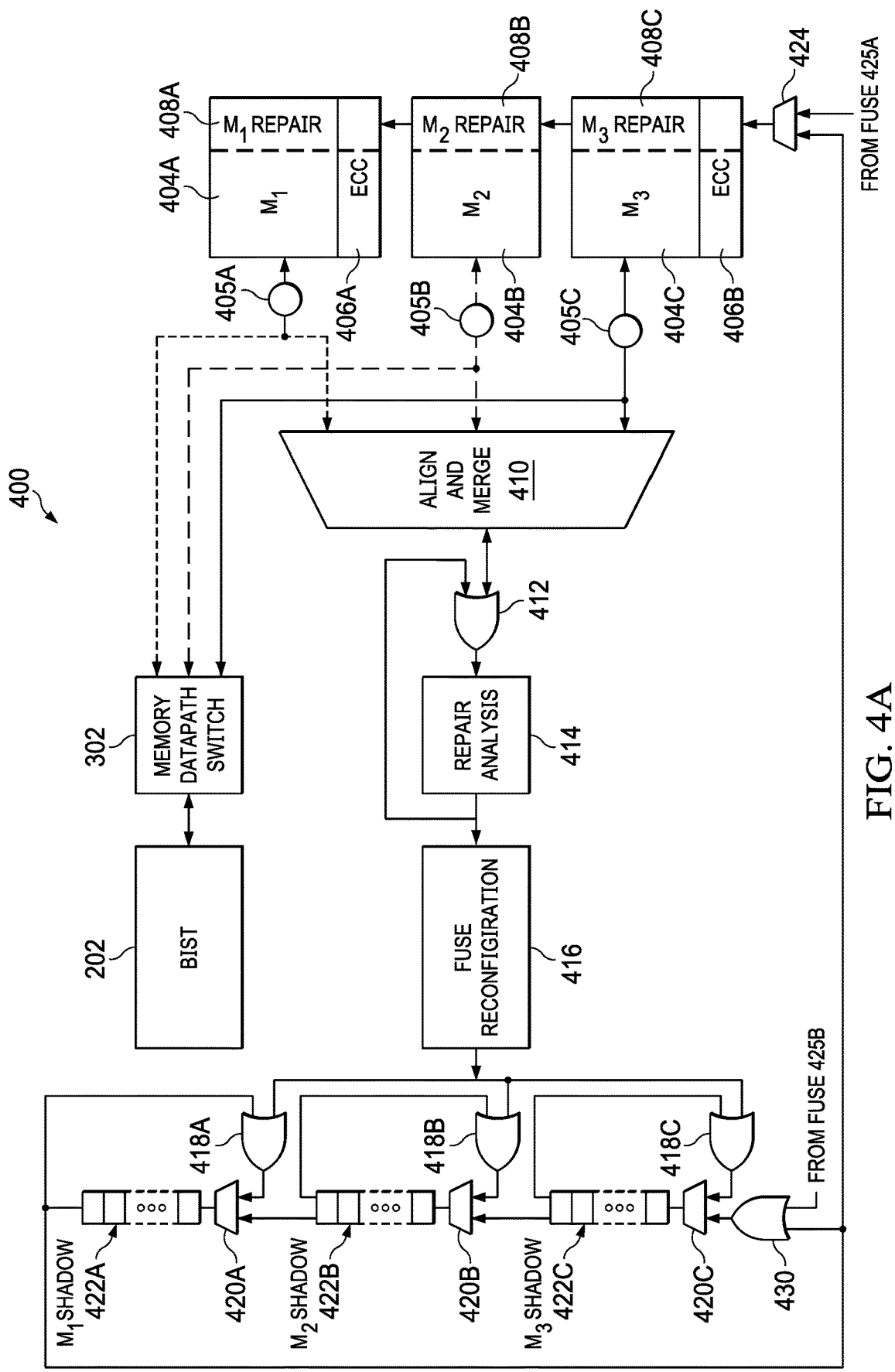
FIG. 4A is a schematic diagram showing a memory repair scenario in accordance with some examples.

In the memory repair scenario 400 of FIG. 4A, various components are represented including the BIST unit 202, the memory datapath switch 302, memory units 404A-404C, local comparator units 405A-405C, an align and merge circuit 410, an OR gate 412, a repair analysis circuit 414, and a fuse reconfiguration circuit 416. The memory repair scenario 400 also includes shadow fuse registers 422A-422C, OR gates 418A-418C and 430, and multiplexers 420A-420C and 424. During the system power-up or initialization sequence before any functional or test operations on the memory units, shadow fuse registers 422A-422C are reset/cleared and the memory repair data (possibly from prior test sessions) stored in FuseROM or a similar non-volatile memory is serially loaded into the corresponding memory repair registers 408A-408C through the input 425A and multiplexer 424. Simultaneously, the corresponding shadow fuse registers 422A-422C are also serially initialized with the same memory repair data through the input 425B and multiplexers 420A-420C. Thus, at the end of system initialization, the shadow fuse registers 422A-422C has identical data as the corresponding memory repair register 408A-408C. In the example of FIG. 4A, a test controller circuit (e.g., the test controller 114 of FIG. 1) controls the multiplexers 424, 420A-C and enables incremental repair components 410, 414, 416, 422A-422C. In different examples, the components represented for the memory repair scenario 400 are part of an IC, SoC, or multi-die module.

In the memory repair scenario 400, the BIST unit 202 performs various operations to test the memory units 404A-404C before and after a repair is complete. In the memory repair scenario 400, the memory units 404A and 404C support ECC repairs and incremental repairs. Meanwhile, the memory unit 404B supports incremental repairs only while relying on memory unit 404C for ECC repair. More specifically, the memory unit 404A includes: 1) additional storage 406A to store signature for ECC repairs; and 2) a set of redundant row/column elements 408A to support incremental repairs. Also, the memory unit 404B includes a set of redundant row/column elements 408B to support incremental repairs. Also, the memory unit 404C includes: 1) additional storage 406B to store signature for ECC repairs; and 2) a set of redundant row/column elements 408A to support incremental repairs. Note: each of the sets of ECC signature storage elements 406A and 406B may have the same number or a different number of bits. Also, each of the sets of redundant row/column elements 408A-408C may have the same number or a different number of redundant elements. Thus, each of the memory units 404A-404C includes its own repair architecture in the memory repair scenario 400.

To perform memory repairs in the memory repair scenario 400, the BIST unit 202 tests the memory units 404A-404C to determine if memory repair is needed. In response to the test from BIST unit, the local compare circuits 405A-405C compute the error from the respective memory units 404A-404C. The local compare circuits 405A-405C are instances of the local compare circuit 255 of FIG. 2B to compute the error from the memory units 404A-404C. The errors from diverse memory units are aligned to a unified format and merged together by the align and merge circuit 410. The cumulative repair information from the align and merge circuit 410 is provided to a repair analysis circuit 414 via an OR gate 412. The output of the repair analysis circuit 414 is provided back to the OR gate 412. The feedback to the OR gate enables incrementally cumulating repairs where errors from multiple test sequences run back-to-back on the same memory unit are cumulated.

The output of the repair analysis circuit 414 is also provided to a fuse reconfiguration circuit 416, which performs the inverse operation of align and merge circuit 410 to reconfigure the repair analysis output in the unified format (converted by align and merge circuit 410) back to the target memory repair architecture. The fuse reconfiguration circuit 416 then writes cumulative repair information (a repair signature for each of the memory units 404A-404C) to shadow fuse registers 422A-422C. The OR gates 418A-418C merges the previously stored repair signature from the shadow fuse register (either from the power-up initialization or prior test sessions) with the new repair signature from the fuse reconfiguration unit 416 and the multiplexers 420A-420C configures the shadow fuse registers to store back the new merged repair signature.

As shown, the outputs from each of the shadow fuse registers 422A-422C is fed back to a respective OR gate 418A-418C and respective multiplexer 420A-420C. After the BIST unit 202 completes testing on all memory units 404A-404C, the newly identified memory repair signature from the shadow fuse registers 422A-422C is stored into the memory repair registers 408A-408C by shifting out through the other input of the multiplexer 424. The other input to the multiplexers 420A-420C are configured to form a shift register by passing the repair information from adjacent shadow fuse registers for each of the memory units 404A-404C. As shown, the output from the shadow fuse register 422A (corresponding to the memory unit 404A) is fed into a multiplexer 424, where the output of the multiplexer 424 is provided to the memory unit 404C. While the data from shadow fuse register 422A is shifted into memory repair register 408C, the data stored in the shadow fuse registers 420C and 420B would have also been shifted into 420B and 420A, respectively. This process continues till the repair registers 408A, 408B and 408C are initialized with the data from the shadow fuse registers 422A, 422B and 422C respectively. The OR-gate 430 ensures that the shadow fuse registers 422A-422C re-circulates its data back during this process. This enables full incremental repair where previous memory repair data stored in 408A-408C which was identical to those stored in the shadow registers 422A-422C (either from initial load from FuseROM or from previous BIST executions), is cumulated with the fails from the new BIST test session and repaired back into the respective memory units. At any point in the process (e.g., at local compare or at align and merge or at repair analysis or at fuse reconfiguration or at shadow fuse accumulation), if a non-repairable error or a failure is identified, the BIST system asserts an error indicating a non-repairable failure.

Figure 4B:
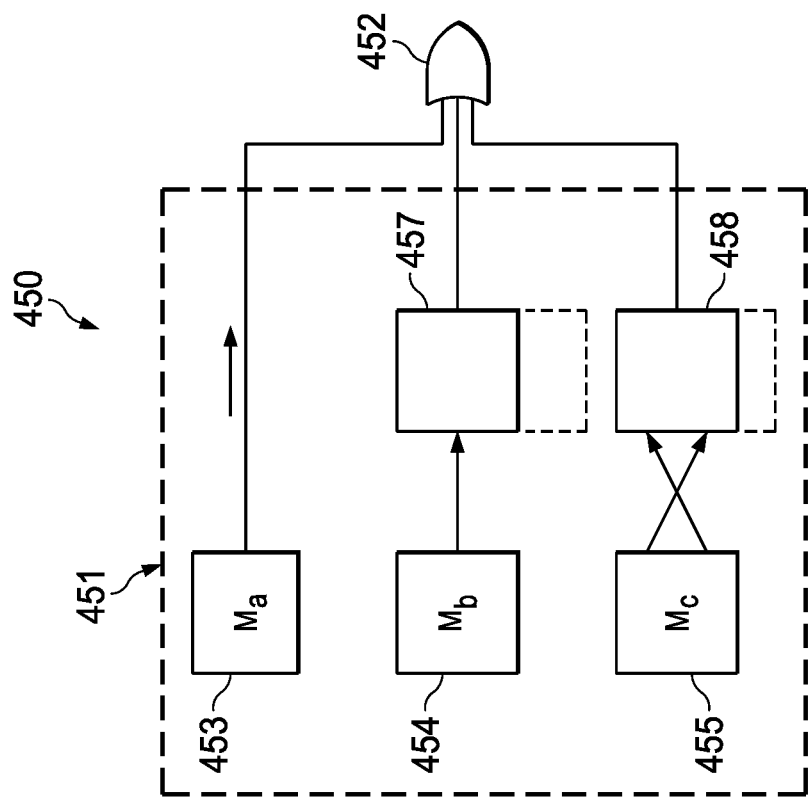
FIG. 4B is a schematic diagram showing an align and merge circuit related to the memory repair scenario of FIG. 4A in accordance with some examples.

FIG. 4B is a schematic diagram showing an align and merge circuit 450 (an example of the align and merge circuit 410 in FIG. 4A) related to the memory repair scenario of FIG. 4A in accordance with some examples. In the example of FIG. 4B, the align and merge circuit 450 includes a component 451 configured to perform the align function. The align and merge circuit 450 also includes an OR gate 452 to perform the merge function. As shown, the component 451 includes memory units 453-455. The memory unit 453 (labeled "$M_a$") has a unified format so that no transformation is performed. The memory unit 454 is shorter than the memory 453 and is aligned to the unified format by component 457, which pads the most significant bits with 0s. The memory unit 455 has a different endian (big endian vs. little endian) ordering and is aligned to the unified format by a component 458, which reverses the bit order and pads the remaining most significant bits with 0s. The unified data provided by the memory unit 453, component 457, and component 458 are merged using the OR gate 452.

Returning to the memory repair scenario 400 of FIG. 4A, ECC repairs or incremental repairs are performed as desired. In one example repair scenario, the BIST unit 202 tests an entire memory set by writing/reading data to/from the memory units 404A-404C. The data written to the memory units 404A-404C is compared by reading an expected data to determine if the memory operations pass or fail. In response to a failed memory operation, a repair is performed and the BIST unit 202 tests the memory units 404A-404C again. As needed, the test and repair process is repeated.

In some examples, ECC repairs have higher priority relative to incremental repairs (e.g., ECC repairs are performed until there are no more errors can be corrected by ECC, then incremental repairs are performed until there are no more redundant columns available). In other examples, ECC repairs have lower priority relative to incremental repairs (e.g., incremental repairs are performed until there are no more redundant columns available for incremental repairs, then ECC repairs are performed until there are no more errors corrected by ECC). In other examples, the priority of ECC repairs relative to incremental repairs is selectable by a user.

Figure 5:
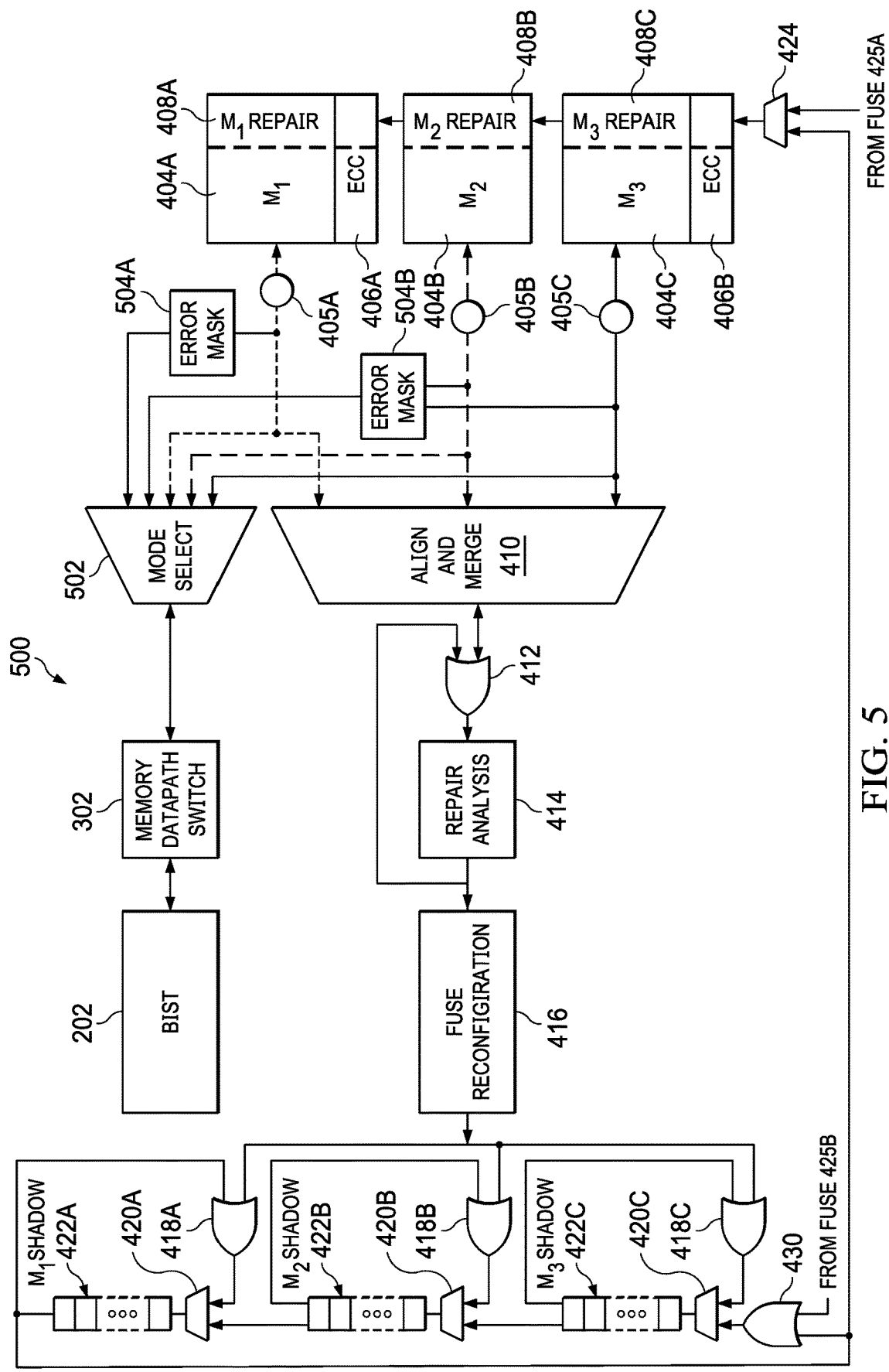
FIG. 5 is a schematic diagram showing a memory repair scenario related to the memory repair scenario in accordance with some examples.

In the memory repair scenario 500 of FIG. 5, various components are represented including the BIST unit 202, the memory datapath switch 302, the memory units 404A-404C, the align and merge circuit 410, the OR gate 412, the repair analysis circuit 414, and the fuse reconfiguration circuit 416. The memory repair scenario 500 also includes shadow fuse registers 422A-422C, OR gates 418A-418C and 430, and multiplexers 420A-420C and 424. The memory repair scenario 500 also includes a mode selection unit 502 and error mask components 504A and 504B. During the system power-up or initialization sequence before any functional or test operations on the memory units 404A-404C, the shadow fuse registers 422A-422C are reset/cleared and the memory repair data (possibly from prior test sessions) stored in FuseROM or a similar non-volatile memory is loaded into the corresponding memory repair registers 408A-408C through the input 425A and the multiplexer 424. In parallel, the corresponding shadow fuse registers 422A-422C are also initialized with the same memory repair data through the input 425B and the multiplexers 420A-420C. Thus, at the end of system initialization, the shadow fuse registers 422A-422C have identical data as the corresponding memory repair registers 408A-408C. In the example of FIG. 5, a test controller circuit (e.g., the test controller 114 of FIG. 1) controls the multiplexers 424, 420A-C and enables incremental repair components 410, 414, 416, 422A-422C. In different examples, the components represented for the memory repair scenario 500 are part of an IC, SoC, or multi-die module.

In the memory repair scenario 500, the BIST unit 202 performs various operations to test memory units 404A-404C before and after a repair is complete. In the memory repair scenario 500, the memory units 404A and 404C support ECC repairs and incremental repairs. Meanwhile, the memory unit 404B supports incremental repairs only while relying on memory unit 404C for ECC repair. Again, the memory unit 404A includes: 1) additional storage 406A to store a signature for ECC repairs; and 2) a set of redundant row/column elements 408A to support incremental repairs. Also, the memory unit 404B includes a set of redundant row/column elements 408B to support incremental repairs. Also, the memory unit 404C includes: 1) additional storage 406B to store a signature for ECC repairs; and 2) a set of redundant row/column elements 408A to support incremental repairs. Each of the sets of ECC signature elements 406A and 406B may have the same number or a different number of bits. Also, each of the sets of redundant row/columns 408A-408C may have the same number or a different number of redundant elements. Thus, each of the memory units 404A-404C includes its own repair architecture in the memory repair scenario 500.

To perform memory repairs in the memory repair scenario 500, the BIST unit 202 tests the memory units 404A-404C to determine if memory repair is needed. In response to the test from BIST unit 202, the local compare circuits 405A-405C compute the error from the respective memory units 404A-404C. The local compare circuits 405A-405C are instances of the local compare circuit 255 of FIG. 2B to compute the error from the memory units 404A-404C. The determination of whether there is an available row/column in the memory repair scenario 500 is based on the availability of redundant rows/columns as well as the operations of the mode select unit 502 and of the error mask units 504A and 504B. For example, if the mode select unit 502 is configured to bybass ECC repairs, the error mask units 504A and 504B are disabled and not provided to the BIST unit 202. On the other hand, if the mode select unit 502 is configured to allow ECC repairs, the error mask units 504A and 504B operate and mask ECC correctable errors before providing the result to the BIST unit 202. Regardless of whether ECC repairs are enabled or disabled in the memory repair scenario, incremental repairs may be performed until redundant columns are unavailable.

Based on the available redundant row/column information provided and the ECC error mask outputs, the BIST unit 202 selects a redundant row/column or ECC error mask (e.g., error masks 504A and 504B) for repair according to a predetermined repair priority scheme (e.g., ECC repairs are assigned higher or lower priority relative to incremental repairs when ECC repairs are enabled by the mode select unit 502). The selected repair is added to all other previous repairs by the align and merge circuit 410. The repair information from the align and merge circuit 410 is provided to a repair analysis circuit 414 via an OR gate 412. The output of the repair analysis circuit 414 is provided back to the OR gate 412

The output of the repair analysis circuit 414 is also provided to a fuse reconfiguration circuit 416, which performs the inverse operation of the align and merge circuit 410 to reconfigure the repair analysis output in the unified format (converted by the align and merge circuit 410) back to the target memory repair architecture. The fuse reconfiguration circuit 416 then writes cumulative writes repair information (a repair signature for each of the memory units 404A-404C) to shadow fuse registers 422A-422C. The OR gates 418A-418C merge the previously stored repair signature from the shadow fuse registers 422A-422C (either from the power-up initialization or prior test sessions) with the new repair signature from the fuse reconfiguration unit 416 and the multiplexers 420A-420C configure the shadow fuse registers 422A-422C to store the new merged repair signature. As shown, the outputs from each of the shadow fuse registers 422A-422C is fed back to a respective OR gate 418A-418C and multiplexer 420A-420C.

After the BIST unit 202 completes testing on all the memory units 404A-404C, the newly identified memory repair signature from the shadow fuse registers 422A-422C is stored into the memory repair registers 408A-408C by shifting out through the other input of the multiplexer 424. The other input to the multiplexers 420A-420C are configured to form a shift register by passing the repair information from adjacent shadow fuse registers for each of the memory units 404A-404C. Again, the output from the shadow fuse register 422A (corresponding to the memory unit 404A) is fed into a multiplexer 424, where the output of the multiplexer 424 is provided to the memory unit 404C. While the data from shadow fuse register 422A is shifted into memory repair register 408C, the data stored in the shadow fuse registers 420C and 420B would have also been shifted into 420B and 420A, respectively. This process continues till the repair registers 408A, 408B and 408C are initialized with the data from the shadow fuse registers 422A, 422B and 422C respectively. The OR-gate 430 ensures that the shadow fuse registers 422A-422C re-circulates its data back during this process. This enables full incremental repair where previous memory repair data stored in 408A-408C which was identical to those stored in the shadow registers 422A-422C (either from initial load from FuseROM or from previous BIST executions), is cumulated with the fails from the new BIST test session and repaired back into the respective memory units. At any point in the process (e.g., at local compare or ECC error mask, at align and merge, at repair analysis, at fuse reconfiguration, at shadow fuse accumulation, etc.), if a non-repairable error or a failure is identified, the BIST unit 202 asserts an error indicating a non-repairable failure.

In one example repair scenario, the BIST unit 202 tests each of the memory unit 404A-404C by performing a write/read operation. The data written to the memory units 404A-404C is compared by reading an expected data to determine if each memory operation passes or fails. In response to a failed memory operation, a repair is performed and the BIST unit 202 tests the memory units 404A-404C again. As needed, the test and repair process is repeated.

When ECC-aware testing is enabled, the error mask units 504A and 504B compare data and mask ECC correctable errors. Also, in some examples, multiple memory units (e.g., the memory units 404B and 404C) are tested as one entity by the BIST unit 202. When incremental repairs are performed, data is written to the memory unit 404A. The expected read data is compared, aligned to a uniform format, analyzed for repair, and cumulated with prior fails. New repair data is reconfigured back to the format for the memory unit 404A and cumulated with prior repairs in the shadow fuse register 422A for the memory unit 404A. Also, initialization of repair and shadow (broadcast in parallel) from fuse components 425A and 425B (e.g., FuseROM or other non-volatile memory) is performed, and repair contents are transferred from the shadow fuse register 422A back to the memory unit 404A in the same order. The same process is repeated for the memory unit 404B and 404C using their respective shadow fuse registers 422B and 422C.

In the memory repair scenario 500, ECC repairs are enabled or disabled as desired by the mode selection unit 502. When ECC repairs are enabled, ECC repairs or incremental repairs are performed according to a predetermined priority scheme. In some examples, ECC repairs have higher priority relative to incremental repairs (e.g., ECC repairs are performed until there are no ECC correctable errors, then incremental repairs are performed until there are no more redundant row/columns available). In other examples, ECC repairs have lower priority relative to incremental repairs (e.g., incremental repairs are performed until there are no more redundant row/columns available for incremental repairs, then ECC repairs are performed until there are no ECC correctable errors). In other examples, the priority of ECC repairs relative to incremental repairs is adjustable based on user input or predetermined rules.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit comprising:
    a memory; and a memory repair circuit coupled to the memory, comprising:
  a first repair circuit configured to repair an error in the memory using an error correcting code; and
  a second repair circuit configured to repair an error in the memory using a redundant portion of the memory,
wherein the memory repair circuit is configured to:
  receive stored test data from the memory;
  determine an error in the memory based on the stored test data;
  select one of the first repair circuit and the second repair circuit based on enablement of the first repair circuit and the second repair circuit; and
  repair the determined error in the memory with the selected repair circuit.

2. The circuit of claim 1, wherein:
the memory includes a first memory and a second memory; and
the first memory independent of the second memory.

3. The circuit of claim 2, further comprising:
a test circuit; and
a switch coupled between the test circuit and the memory, wherein the switch is configured to couple the test circuit to one of the first memory and the second memory.

4. The circuit of claim 2, further comprising:
a first register configured to store first repair information for the first memory; and
a second register configured to store second repair information for the second memory.

5. The circuit of claim 1, further comprising:
a test circuit coupled to the memory, wherein the test circuit is configured to input a set of test data to the memory to form the stored test data.

6. The circuit of claim 1, wherein:
the first repair circuit is configured to repair an error in the memory by masking a predetermined number of one or more bit errors associated with the error using the error correcting code; and
the second repair circuit is configured to repair an error in the memory by replacing a portion of the memory associated with the error using the redundant portion of the memory, wherein the redundant portion of the memory includes a column or a row of the memory.

7. The circuit of claim 1, wherein the memory repair circuit is configured to:
in response to the first repair circuit being disabled, select the second repair circuit; and
in response to the second repair circuit being disabled, select the first repair circuit.

8. The circuit of claim 1, wherein the memory repair circuit is configured to:
select one of the first repair circuit and the second repair circuit based on a priority in addition to enablement of the first and second repair circuits.

9. The circuit of claim 8, wherein:
the priority is one of a predetermined priority and an adjustable priority.

10. The circuit of claim 9, wherein:
the adjustable priority is based on one of user input and a predetermined trigger.

11. A method comprising:
receiving, by a memory repair circuit, stored test data;
determining, by the memory repair circuit, an error in a memory based on the stored test data;
selecting, by the memory repair circuit, one of a first repair circuit and a second repair circuit based on enablement of the first repair circuit and the second repair circuit, wherein the first repair circuit repairs an error in the memory using an error correcting code, and wherein the second repair circuit repairs an error in the memory using a redundant portion of the memory; and
repairing, by the memory repair circuit, the determined error in the memory using the selected repair circuit.

12. The method of claim 11, wherein:
the memory includes a first memory and a second memory; and
the first memory independent of the second memory.

13. The method of claim 12, further comprising:
coupling a test circuit to one of the first memory and the second memory using a switch coupled between the test circuit and the memory.

14. The method of claim 12, further comprising:
storing, by a first register, first repair information for the first memory; and
storing, by a second register, second repair information for the second memory.

15. The method of claim 11, further comprising:
inputting, by a test circuit coupled to the memory, a set of test data to the memory to form the stored test data.

16. The method of claim 11, wherein:
the first repair circuit repairs an error in the memory by masking a predetermined number of one or more bit errors associated with the error using the error correcting code; and
the second repair circuit repairs an error in the memory by replacing a portion of the memory associated with the error using the redundant portion of the memory, wherein the redundant portion of the memory includes a column or a row of the memory.

17. The method of claim 11, wherein:
in response to the first repair circuit being disabled, the selected repair circuit is the second repair circuit; and
in response to the second repair circuit being disabled, the selected repair circuit is the first repair circuit.

18. The method of claim 11, wherein selecting one of the first repair circuit and the second repair circuit comprises:
selecting one of the first and second repair circuits based on a priority in addition to enablement of the first and second repair circuits.

19. The method of claim 18, wherein:
the priority is one of a predetermined priority and an adjustable priority.

20. The method of claim 19, wherein:
the adjustable priority is based on one of user input and a predetermined trigger.

* * * * *